United States Patent
Huang et al.

(10) Patent No.: US 9,207,710 B2
(45) Date of Patent: Dec. 8, 2015

(54) BACK FRAME AND LIQUID DISPLAY DEVICE WITH THE SAME

(75) Inventors: Chong Huang, Shenzhen (CN);
Yu-chun Hsiao, Shenzhen (CN);
Yi-cheng Kuo, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 374 days.

(21) Appl. No.: 13/634,878

(22) PCT Filed: Aug. 30, 2012

(86) PCT No.: PCT/CN2012/080755
§ 371 (c)(1),
(2), (4) Date: Sep. 14, 2012

(87) PCT Pub. No.: WO2014/032247
PCT Pub. Date: Mar. 6, 2014

(65) Prior Publication Data
US 2014/0063698 A1    Mar. 6, 2014

(30) Foreign Application Priority Data
Aug. 28, 2012  (CN) .......................... 2012 1 0310043

(51) Int. Cl.
*G06F 1/16* (2006.01)
*G02F 1/1333* (2006.01)
*H05K 7/18* (2006.01)
*H05K 5/02* (2006.01)

(52) U.S. Cl.
CPC ............ *G06F 1/1601* (2013.01); *G02F 1/1333* (2013.01); *G02F 1/133308* (2013.01); *G06F 1/1637* (2013.01); *H05K 5/02* (2013.01); *H05K 7/18* (2013.01); *G02F 2001/133314* (2013.01); *G02F 2001/133328* (2013.01)

(58) Field of Classification Search
CPC ................ G06F 1/1601; G06F 1/1637; G02F 1/133308; G02F 2001/133314; G02F 2001/133328; G02F 1/133608
USPC .......................... 361/679.24, 679.01–679.45, 361/679.55–679.59; 349/58–60; 362/632–634; 211/26
See application file for complete search history.

(56) References Cited

U.S. PATENT DOCUMENTS

| | | | |
|---|---|---|---|
| 7,178,967 B2 * | 2/2007 | Kim .............................. | 362/633 |
| 8,284,548 B2 * | 10/2012 | Takechi ................... | 361/679.22 |
| 2007/0273809 A1 * | 11/2007 | Lee ................. | 349/58 |
| 2009/0059115 A1 * | 3/2009 | Asano et al. ................... | 349/60 |
| 2010/0182531 A1 * | 7/2010 | Teratani .......................... | 349/58 |
| 2010/0188598 A1 * | 7/2010 | Suzuki ........................... | 349/58 |
| 2010/0225845 A1 * | 9/2010 | Liu .................................. | 349/58 |
| 2010/0296022 A1 * | 11/2010 | Ando .............................. | 349/58 |
| 2012/0050637 A1 * | 3/2012 | Harada et al. .................. | 349/58 |
| 2013/0126450 A1 * | 5/2013 | Kuo et al. ....................... | 211/26 |
| 2013/0128425 A1 * | 5/2013 | Cheng et al. ............ | 361/679.01 |
| 2014/0016061 A1 * | 1/2014 | Kuo et al. ...................... | 349/58 |

* cited by examiner

*Primary Examiner* — Nidhi Thaker
(74) *Attorney, Agent, or Firm* — Andrew C. Cheng

(57) ABSTRACT

A back frame including at least two main pieces is disclosed. The adjacent main pieces are assembled via assembly sections, and a plurality of anchor points are arranged on different locations of each of the assembly sections. The size of the back frame is variably configured by assembling the adjacent main pieces through different anchor points. The main pieces with anchor points on different locations may be manufactured by the same mold. The main pieces are assembled to form back frame with different sizes so as to reduce the mold cost and the manufacturing cost.

14 Claims, 7 Drawing Sheets

BACK FRAME AND LIQUID DISPLAY DEVICE WITH THE SAME

BACKGROUND OF THE INVENTION

1. Field of the Invention

Embodiments of the present disclosure relate to display technology, and more particularly to a back frame and a liquid crystal device with the same.

2. Discussion of the Related Art

Liquid crystal devices include liquid crystal panels and backlight modules. The bottom of the backlight module includes a back frame for engaging with the front, frame to fasten the liquid crystal panel and the backlight module. Currently, the one-piece back frame is integrally formed by metal punching processes or by injecting plastic materials. In this way, the material cost of the liquid crystal device is relatively high. At the same time, larger punching devices and corresponding molds are needed for back frames with larger size. in addition, different molds are also needed for manufacturing back frames with different sizes so that the cost is high and the development cycle is long.

SUMMARY

The object of the claimed invention is to provide a back frame and a liquid crystal device incorporated the back frame. The main pieces manufactured by the same mold may be assembled to form back frames with different sizes. Thus, the mold cost and the manufacturing cost are reduced.

In one aspect, a back frame includes at least two main pieces. The adjacent main pieces are assembled via assembly sections, and a plurality of anchor points are arranged on different locations of each of the assembly sections. The size of the back frame is variably configured by assembling the at least two adjacent main pieces through different anchor points. Wherein the anchor points are rivet holes. screw holes, non-hole rivet points, or welding points. The assembly sections of the main pieces further include protrusions surrounding by the plurality of anchor points.

Wherein the protrusions include a first protrusion and a second protrusion respectively arranged on the assembly sections of the two adjacent main pieces, and the second protrusion is received in a space limited by the first protrusion.

Wherein the back frame includes a first main piece and a second main piece. The first main piece includes a first main portion and a first extended portion vertically extended from one end of the first main portion, the second main piece includes a second main portion and a second extended portion vertically extended from one end of the second main portion. Wherein the first main portion and the second extended portion, and the second main portion and the first extended portion are respectively assembled together by the anchor points so as to form the back frame.

Wherein the back frame includes two parallel, spaced apart first main pieces and two parallel, spaced apart second main pieces, and wherein ends of the first main pieces respectively connects with ends of the second main pieces by the anchor points so as to form the back frame.

In another aspect, a back frame includes at least two main pieces. The adjacent main pieces are assembled via assembly sections, and a plurality of anchor points are arranged on different locations of each of the assembly sections, and the size of the back frame is variably configured by assembling the at least two adjacent main pieces through different anchor points.

Wherein the anchor points are rivet holes, screw holes, non-hole rivet points, or welding points.

Wherein the back frame includes a first main piece and a second main piece. The first main piece includes a first main portion and a first extended portion vertically extended from one end of the first main portion, and the second main piece includes a second main portion and a second extended portion vertically extended from one end of the second main portion. Wherein the first main portion and the second extended portion, and the second main portion and the first extended portion are respectively assembled together by the anchor points so as to form the back frame.

Wherein a plurality of auxiliary supports are arranged between the first main portion and the second main portion, and two ends of the auxiliary supports respectively connects to the first main portion and the second main portion.

Wherein the back frame includes two parallel, spaced apart first main pieces and two parallel, spaced apart second main pieces, and wherein ends of the first main pieces respectively connects with ends of the second main pieces by the anchor points so as to form the back frame.

Wherein a plurality of auxiliary supports are arranged between the two first main pieces, and two ends of the auxiliary supports respectively connects to the first main pieces.

Wherein the assembly sections of the main pieces further includes protrusions surrounding by the plurality of anchor points.

Wherein the protrusions include a first protrusion and a second protrusion respectively arranged on the assembly sections of the two adjacent main pieces, and the second protrusion is received in as space limited by the first protrusion.

Wherein the protrusions are integrally formed with the main pieces by compression.

In another aspect, a liquid crystal device includes a back frame having at least two main pieces. The adjacent main pieces are assembled via assembly sections, and a plurality of anchor points are arranged on different locations of each of the assembly sections. The size of the back frame is variably configured by assembling the at least two adjacent main pieces through different anchor points.

Wherein the anchor points are rivet holes, screw holes, non-hole rivet points, or welding points.

Wherein the back frame includes a first main piece and a second main piece, the first main piece includes a first main portion and a first extended portion vertically extended from one end of the first main portion, and the second main piece includes a second main portion and a second extended portion vertically extended from one end of the second main portion. Wherein the first main portion and the second extended portion, and the second main portion and the first extended portion are respectively assembled together by the anchor points so as to form the back frame.

Wherein the back frame includes two parallel, spaced apart first main pieces and two parallel, spaced apart second main pieces, and wherein ends of the first main pieces respectively connects with ends of the second main pieces by the anchor points so as to form the back frame.

Wherein the assembly sections of the main pieces further include protrusions surrounding by the plurality or anchor points.

DETAILED DESCRIPTION OF THE EMBODIMENTS

Embodiments of the invention will now be described more fully hereinafter with reference to the accompanying drawings, in which embodiments of the invention are shown.

Figure 1:
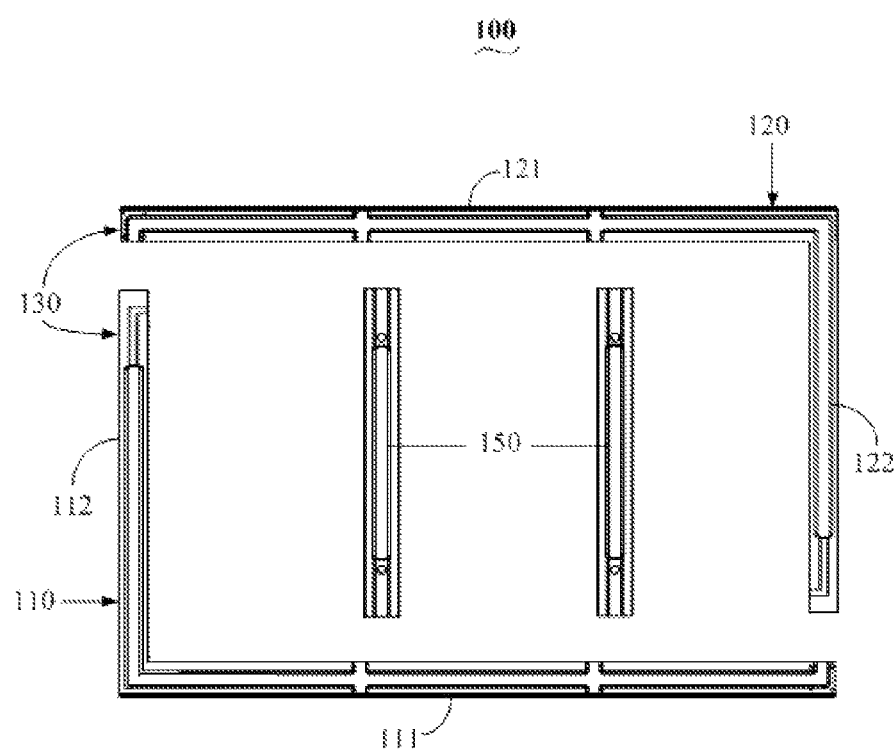
FIG. 1 is an exploded schematic view of the structure of a back frame in accordance with a first embodiment of the claimed invention.

FIG. 1 is an exploded schematic view of the structure of a back frame in accordance with a first embodiment of the claimed invention. As shown, the back frame 100 includes a first main piece 110, a second main piece 120, and two auxiliary supports 150.

The first main piece 110 and the second main piece 120 are L-shaped and are assembled via assembly sections 130 to form an outer frame of the back frame 100.

Specifically, the first main piece 110 includes a first main portion 111 and a first extended portion 112 vertically extended from one end of the first main portion 111. The second main piece 120 includes a second main portion 121 and a second extended portion 122 vertically extended from one end of the second main portion 121. The first main portion 111 and the second extended portion 122, and the second main portion 121 and the first extended portion 112 are respectively assembled together by a plurality of anchor points 140 of the assembly sections 130 so as to form the outer frame of the back frame 100 as shown in FIG. 2.

Figure 2:
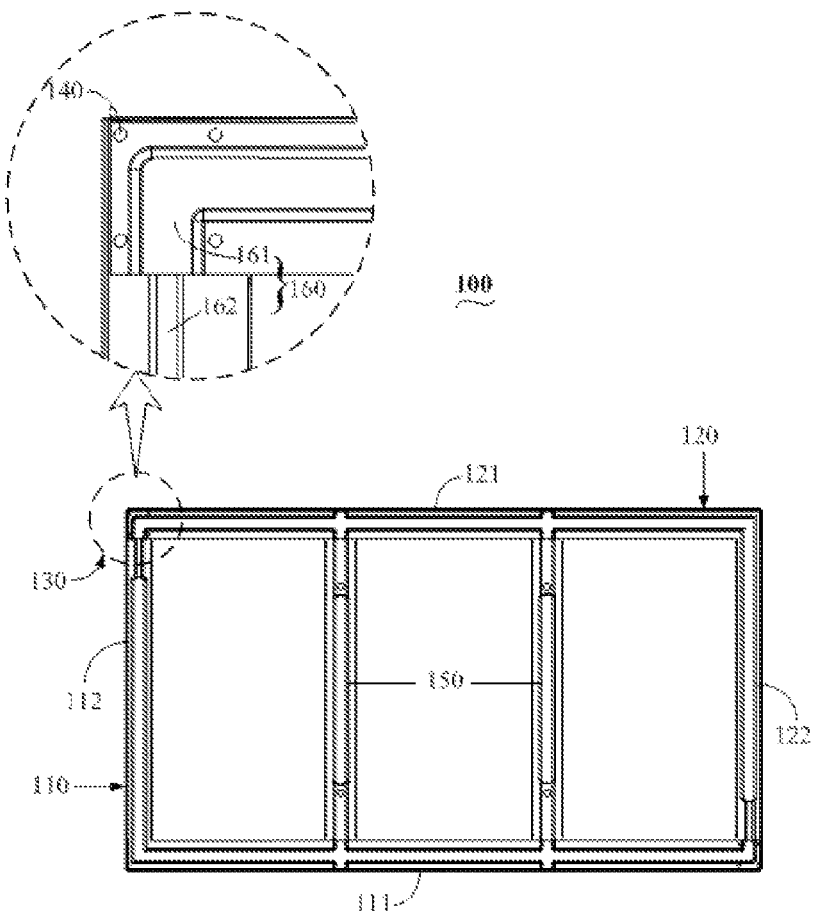
FIG. 2 is a schematic view of the structure of the back frame in accordance with the first embodiment of the claimed invention.

As shown in FIG. 2, two ends of the auxiliary supports 150 respectively connects to the first main portion 111 and the second main portion 121. The auxiliary supports 150 are parallel to the first extended portion 112 and the second extended portion 122. In the embodiment, the auxiliary supports 150 increase the structural strength and stability of the back frame 100. In other embodiments, the number of the auxiliary supports 150 may be one or more than one.

Figure 3:
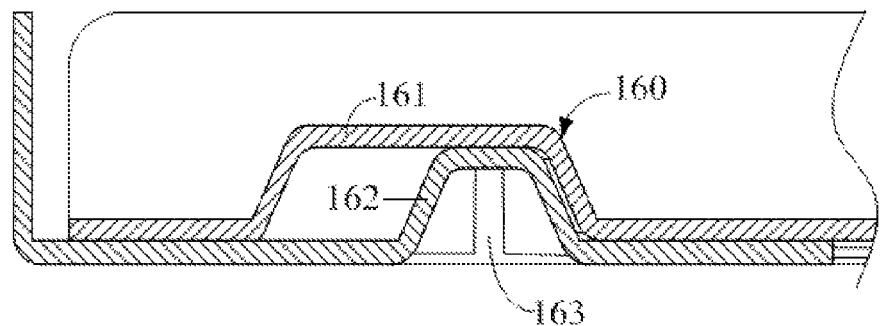
FIG. 3 is a partial section view of assembly sections of the back frame of FIG. 2.

In the embodiment, protrusions 160 are respectively arranged on the assembly sections 130 of the first main piece 110 and the second main piece 120 so as to increase the connecting strength of the assembly sections 130 of the back frame 100. The protrusions 160 are integrally formed with the first main piece 110 and the second main piece 120 by compression. FIG. 3 is a partial section view of the assembly sections of the back frame of FIG. 2. Referring to FIGS. 2 and 3, the protrusions 160 include a first protrusion 161 and a second protrusion 162. The second protrusion 162 is arranged on the assembly sections 130 of the second main portion 121 and the first main portion 111. The second protrusion 162 is arranged on the assembly sections 130 of the second main portion 121 and the first main portion 111. The second protrusion 162 is received in a space limited by the first protrusion 161, and may be slid according to the size of the back frame 100. In addition, the top of the first protrusion 161 is closely adjacent to the top of the second protrusion 162.

In the embodiment, a support 163 is arranged in the bottom of the second protrusion 162 to prevent the protrusions 160 from being deformed due to stress from the light guiding plate and the liquid crystal panel during the assembly process of the back frame 100. After the protrusions 160 is shaped by punching molding processes, the support 163 is respectively assembled on the first extended portion 112 of the first main piece 110 and on the second extended portion 122 of the second main piece 120. In other embodiments, the second protrusion 162 may be a solid structure.

Figure 4:
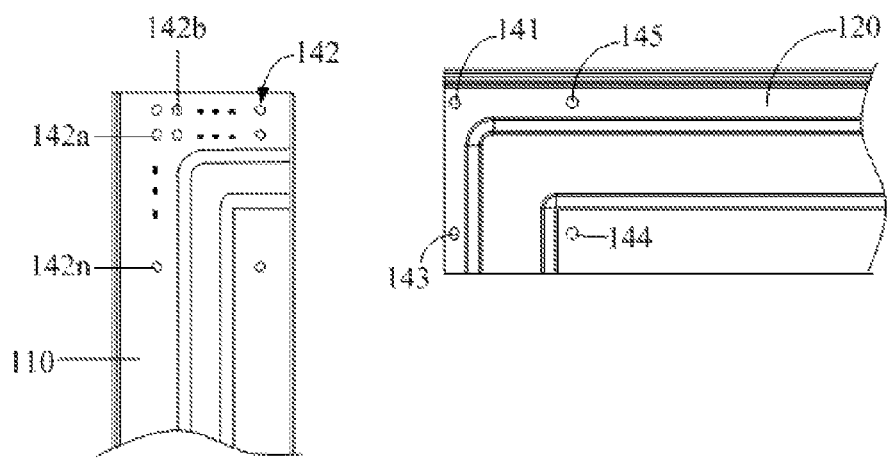
FIG. 4 is an exploded schematic view of the assembly sections of FIG. 2.

FIG. 4 is an exploded schematic view of the assembly sections of FIG. 2. As shown in FIG. 4, the anchor points 140 are arranged to surround the protrusions 160. The second main piece 120 includes four anchor points 141, 143, 144, 145, and the first main piece 110 includes four anchor points 142. The anchor points 142 includes a plurality of anchor points 142a, 142b, . . . , 142n, which are arranged to configure different sizes for the back frame 100. The number of the anchor points on the second main piece 120 is not limited to four as described above, and may be adjusted according to different configurations.

The anchor points 142a, 142b, . . . , 142n are arranged in matrix array. In the embodiment, the size of the back frame 100 not only may be variable by one dimensional adjustment in length or width, but also may be variable by two dimensional adjustment in length or width. Specifically, the auxiliary supports 150 are taken off when the back frame 100 is formed with the desired size and the anchor points 141 of the second main piece 120 are aligned with the anchor points 142a, 142b, . . . , 142n of the first main piece 110. It is to be noted that the anchor points 141 are preferably selected as the reference point. After aligning the anchor point 141 and the anchor point 142a, the anchor points 143, 144, 145 are aligned with other anchor points of the first main piece 110. In other embodiments, the anchor points 143, 144, 145 may be selected as the reference point.

The processes of the above one dimensional adjustment and two dimensional adjustments are described as below.

Figure 5:
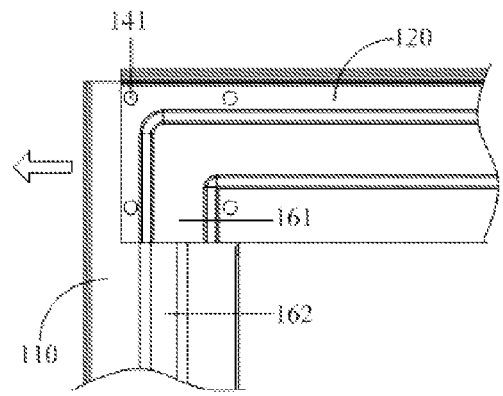
FIG. 5 is a partial schematic view illustrating one dimensional adjustment of the back frame of FIG. 2.
Figure 6:
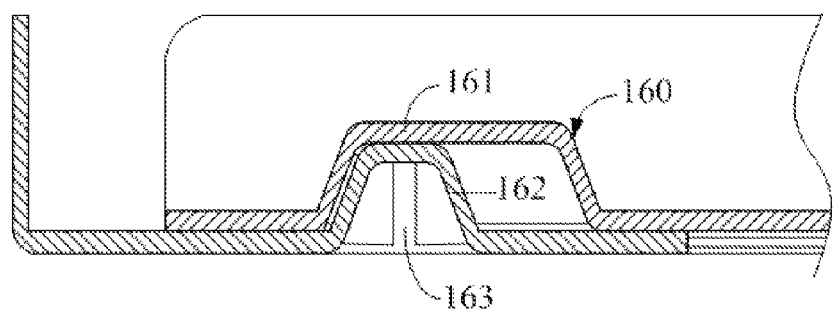
FIG. 6 is a partial section view illustrating two dimensional adjustment of the back frame of FIG. 2.

One dimensional adjustment: The first main piece 110 is pulled in the length direction of the back frame 100 (as indicated by arrow in FIG. 5) when the back frame 100 with the desired size corresponding to anchor point 142a is needed. As shown in FIG. 6, the locations of the first protrusion 161 and the second protrusion 162 have changed. The anchor points 141 are aligned with the anchor point 142a, and the anchor points 143, 144, 145 are aligned with other anchor points on the first main piece 110. In this way, after assembled, the length of the back frame 100 is increased.

Figure 7:
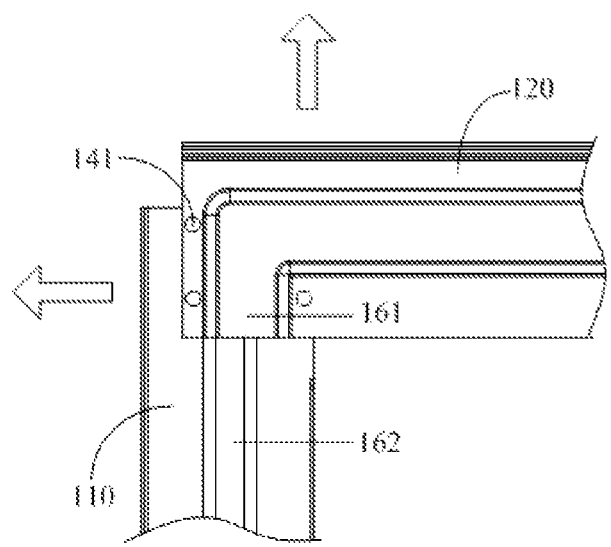
FIG. 7 is a partial schematic view of the back frame of FIG. 2 after the two dimensional adjustment.

Two dimensional adjustment: The first main piece 110 is pulled in the length direction or the back frame 100 as described above and is pulled in the width direction of the back frame 100 (as indicated by arrow in FIG. 7) when the back frame 100 with the desired size corresponding to anchor points 142b, 142n is needed. The locations of the first protrusion 161 and the second protrusion 162 have changed (not shown). The anchor points 141 is aligned with the anchor point 142b, 142n, and the anchor points 143, 144, 145 are aligned with other anchor points on the first main piece 110. In this way, after assembled, the length and the width of the back frame 100 is increased. It is understood that the back frame 100 may be assembled by different ways. The anchor points 140 may be rivet holes, screw holes, non-hole rivet points, or welding points.

Figure 8:
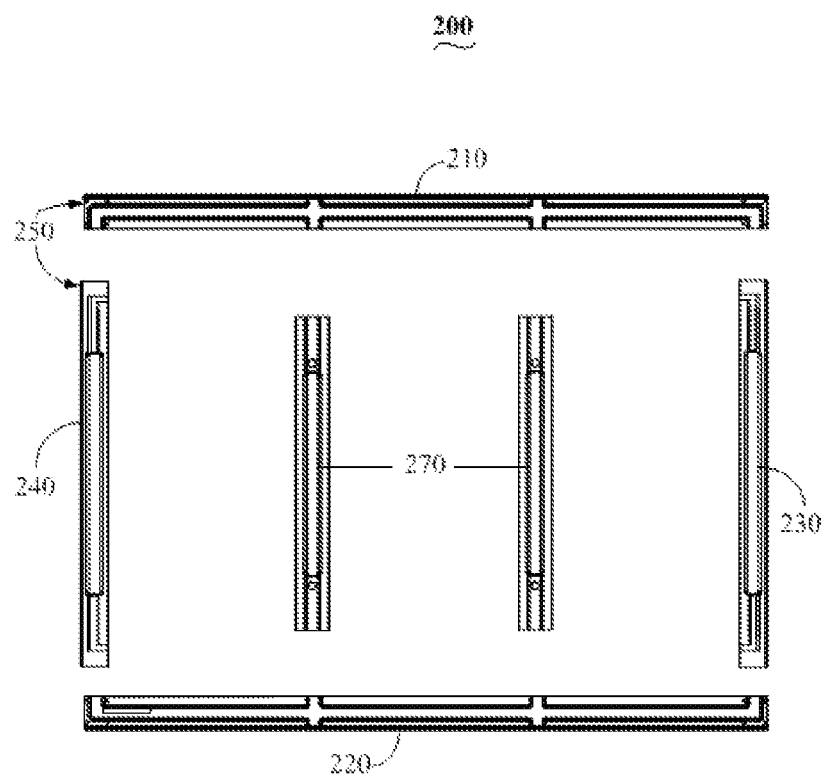
FIG. 8 is an exploded schematic view of the structure of a back frame in accordance with a second embodiment of the claimed invention.

Furthermore, after the anchor points 140 are fixed, the auxiliary supports 150 are fixed on the first main piece 110 and the second main piece 120. It is to be noted that two ends of the auxiliary supports 150 include fixing members similar to the anchor points 140. FIG. 8 is an exploded schematic view of the structure of the back frame in accordance with a second embodiment of the claimed invention. In the embodiment, the back frame 200 includes two first main pieces 210, 220, two second main pieces 230, 240, the assembly sections 250, and two auxiliary supports 270.

Figure 9:
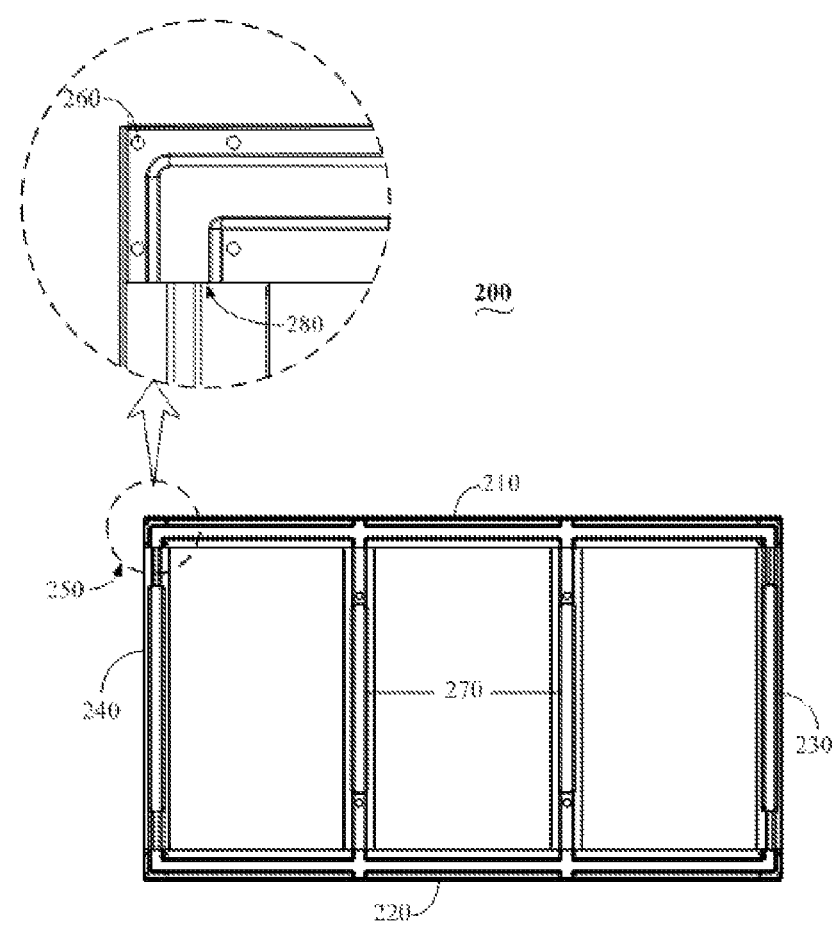
FIG. 9 is a schematic view of the structure of the back frame in accordance with the second embodiment of the claimed invention.

The difference between the first embodiment and the second embodiment resides in that the first main pieces 210, 220 and the second main pieces 230, 240 are bar-shaped. The first main pieces 210, 220 and the second main pieces 230, 240 are assembled together to form the outer frame of the back frame 200. Specifically, the two first main pieces 210, 220 are parallel and spaced part from each other, and the two second main pieces 230, 240 are also parallel and spaced part from each other. Two ends of the first main piece 210 respectively connects with the two second main pieces 230 by the assembly sections 250, and two ends of the first main piece 220 respectively connects with the second main pieces 230 and 240 by the assembly sections. Two ends of the auxiliary supports 270 respectively connect with the first main pieces 210, 220. The auxiliary supports 270 are parallel to the second main pieces 230, 240 to form the back frame 200 as shown in FIG 9.

The structures and the mechanisms of the anchor points 260, the auxiliary supports 270, and the protrusions 280 are the same with the anchor points 140, the auxiliary supports 150, and the protrusions 160 disclosed in the first embodiment.

In the second embodiment, the size of the back frame 200 may be changed with the one or two dimensional adjustment by engaging the anchor points 260 on the four assembly sections 250. In the first embodiment, the size of the back frame 100 may be changed with the one or two dimensional adjustment by engaging the anchor points 140 on the assembly sections 130.

In other embodiments, the number and the location of the anchor points on the assembly sections, or the configurations of the first and second main pieces may be changed. The size of the back frame may be variable only by assembling the first and second main pieces via the anchor points in different locations. Especially, the object of the claimed invention may be easily achieved for back frames with similar size, such as the back frames with a sin range from 37 to 39 inches or from 46 to 48 inches.

In addition, in one embodiment, a liquid crystal device includes the back frame 100 disclosed in the above first embodiment. In another embodiment, a liquid crystal device includes the back frame 200 disclosed in the above second embodiment.

In view of the above, the first main pieces and the second main pieces with a plurality of anchor points arranged in different locations are assembled together to form the back frame. The first main pieces and the second main pieces may be manufactured by the same mold. The back frames assembled by the first main pieces and the second main pieces may have variable sizes. In this way, the mold cost and the development cycle may be reduced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A back frame, comprising: at least two main pieces, the adjacent main pieces are assembled via assembly sections, a plurality of anchor points are arranged on different locations of each of the assembly sections, the size of the back frame is variably configured by assembling the at least two adjacent main pieces through different anchor points; and
   wherein the anchor points are rivet holes, screw holes, non-hole rivet points, or welding points, and the assembly sections of the main pieces further comprise protrusions surrounding by the plurality of anchor points; wherein the protrusions comprise a first protrusion and a second protrusion respectively arranged on the assembly sections of the two adjacent main pieces, the second protrusion is received in a space limited by the first protrusion, and a top of the first protrusion is closely adjacent to a top of the second protrusion, and a support being arranged in the bottom of the second protrusion to prevent the protrusions from being deformed.

2. The back frame as claimed in claim 1, wherein the back frame comprises a first main piece and a second main piece, the first main piece comprises a first main portion and a first extended portion vertically extended from one end of the first main portion, the second main piece comprises a second main portion and a second extended portion vertically extended from one end of the second main portion, wherein the first main portion and the second extended portion, the second main portion and the first extended portion are respectively assembled together by the anchor points so as to form the back frame.

3. The back frame as claimed in claim 1, wherein the back frame comprises two parallel, spaced apart first main pieces and two parallel, spaced apart second main pieces, and wherein ends of the first main pieces respectively connects with ends of the second main pieces by the anchor points so as to form the back frame.

4. A back frame, comprising:
   at least two main pieces, the adjacent main pieces are assembled via assembly sections, a plurality of anchor points are arranged on different locations of each of the assembly sections, and the size of the back frame is variably configured by assembling the at least two adjacent main pieces through different anchor points;
   wherein the assembly sections of the main pieces further comprises protrusions surrounding by the plurality of anchor points, the protrusions comprise a first protrusion and a second protrusion respectively arranged on the assembly sections of the two adjacent main pieces, the second protrusion is received in a space limited by the first protrusion, and a top of the first protrusion is closely adjacent to a top of the second protrusion, and a support being arranged in the bottom of the second protrusion to prevent the protrusions from being deformed.

5. The back frame as claimed in claim 4, wherein the anchor points are rivet holes, screw holes, non-hole rivet points, or welding points.

6. The back frame as claimed in claim 4, wherein the back frame comprises a first main piece and a second main piece, the first main piece comprises a first main portion and a first extended portion vertically extended front one end of the first main portion, the second main piece comprises a second main portion and a second extended portion vertically extended from one end of the second main portion, wherein the first main portion and the second extended portion, the second main portion and the first extended portion are respectively assembled together by the anchor points so as to form the back frame.

7. The back frame as claimed in claim 6, wherein a plurality of auxiliary supports are arranged between the first main portion and the second main portion, and two ends of the auxiliary supports respectively connects to the first main portion and the second main portion.

8. The back frame as claimed in claim 4, wherein the back frame comprises two parallel, spaced apart first main pieces and two parallel, spaced apart second main pieces, and wherein ends of the first main pieces respectively connects with ends of the second main pieces by the anchor points so as to form the back frame.

9. The back frame as claimed in claim 8, wherein a plurality of auxiliary supports are arranged between the two first main pieces, and two ends of the auxiliary supports respectively connects to the first main pieces.

10. The back frame as claimed in claim 4, wherein the protrusions are integrally formed with the main pieces by compression.

11. A liquid crystal device, comprising:
a back frame comprising at least two main pieces, the adjacent main pieces are assembled via assembly sections, a plurality of anchor points are arranged on different locations of each of the assembly sections, the size of the back frame is variably configured by assembling the at least two adjacent main pieces through different anchor points; and
wherein the assembly sections of the main pieces further comprise protrusions surrounding by the plurality of anchor points, the protrusions comprise a first protrusion and a second protrusion respectively arranged on the assembly sections of the two adjacent main pieces, the second protrusion is received in a space limited by the first protrusion, and a top of the first protrusion is closely adjacent to a top of the second protrusion, and a support being arranged in the bottom of the second protrusion to prevent the protrusions from being deformed.

12. The liquid crystal device as claimed in claim 11, wherein the anchor points are rivet holes, screw holes, non-hole rivet points, or welding points.

13. The liquid crystal device as claimed in claim 11, wherein the back frame comprises a first main piece and a second main piece, the first main piece comprises a first main portion and a first extended portion vertically extended from one end of the first main portion, the second main piece comprises a second main portion and a second extended portion vertically extended from one end of the second main portion, wherein the first main portion and the second extended portion, and the second main portion and the first extended portion are respectively assembled together by the anchor points so as to form the back frame.

14. The liquid crystal device as claimed in claim 11, wherein the back frame comprises two parallel, spaced apart first main pieces and two parallel, spaced apart second main pieces, and wherein ends of the first main pieces respectively connects with ends of the second main pieces by the anchor points so as to form the back frame.

* * * * *